(12) United States Patent
Sinclair

(10) Patent No.: US 9,460,168 B1
(45) Date of Patent: Oct. 4, 2016

(54) EVENT VISUALIZATION

(71) Applicant: John Sinclair, Fairfax, VA (US)

(72) Inventor: John Sinclair, Fairfax, VA (US)

(73) Assignee: Synclayer, LLC, Fairfax, VA (US)

( * ) Notice: Subject to any disclaimer, the term of this patent is extended or adjusted under 35 U.S.C. 154(b) by 0 days.

(21) Appl. No.: 15/045,487

(22) Filed: Feb. 17, 2016

(51) Int. Cl.
*G06F 7/00* (2006.01)
*G06F 17/30* (2006.01)

(52) U.S. Cl.
CPC ... *G06F 17/30554* (2013.01); *G06F 17/30241* (2013.01)

(58) Field of Classification Search
None
See application file for complete search history.

(56) References Cited

U.S. PATENT DOCUMENTS

| 8,694,670 B2 | 4/2014 | Batson |
| 8,872,799 B2 | 10/2014 | Majunmder |
| 2006/0028488 A1* | 2/2006 | Gabay ............... H04L 29/06027 345/626 |
| 2012/0030244 A1* | 2/2012 | John .................. G06F 17/3089 707/797 |
| 2013/0012242 A1* | 1/2013 | Nag ...................... H04W 4/185 455/457 |
| 2014/0032548 A1* | 1/2014 | Gilra ................ G06F 17/30038 707/736 |
| 2014/0245463 A1* | 8/2014 | Suryanarayanan ..... G06F 21/10 726/28 |
| 2014/0355947 A1* | 12/2014 | Slamecka ................ H04N 5/91 386/201 |

* cited by examiner

*Primary Examiner* — Tuan A Pham
(74) *Attorney, Agent, or Firm* — Da Vinci's Notebook, LLC

(57) ABSTRACT

The present invention includes a system and process to visualize an event. The event visualization includes one or more physical entities that generate data experienced thereby and generate executable files related to their vantage points. A file manipulation engines normalizes data both existing in pure data form as well as data within the executable files. A visual display renders a representation of the data along with executable files that are correlated to the data.

20 Claims, 8 Drawing Sheets

EVENT VISUALIZATION

FIELD OF THE INVENTION

The present invention relates to the field of data analysis and more specifically to the field of computer-aided event simulation/reproduction.

BACKGROUND

Data analysis is more of an art than a science. Many events and actions are foreseeable, however, the rate at which data can be processed and reviewed, and the staggering amount of data available, makes data analysis a formidable task. For any given day the data exists to determine the weather for the next day, but that data is also hidden amongst data that leads to the incorrect conclusion. The ability to draw valid relationships between data points involves wisdom and experience, as much as good data. Nevertheless the data must be available, and data lacking significant information should be minimized while information-rich data should be capable of simplified access.

Enormous advances have been made in processing, searching and extracting specific information and items of interest from the ever-increasing amount of collected data. Piecewise datasets from many data sources that are related to a specific event of interest are frequently identified and isolated for detailed review. These datasets, such as tracking coordinates, images, videos, metadata, etc., each hold potential contributions in describing the event of interest from unique perspectives. Without the right toolset, organizing these datasets in a manner that ensures each impact to the event of interest can be realized is a daunting task. Additionally, examining each data product separately rarely develops the necessary comprehensive understanding of how the loosely related datasets interrelate.

Constructing a visualization of event data is an effective tool for conceptualizing and sharing an understanding of what occurred, but its effectiveness has been hampered by the time consuming nature of manual synchronization and manipulation of datasets. Analysts reviewing event driven data need a comprehensive, state of the art, data synchronization and visualization tool that allows them to interpret the events described by assorted data; and, to create a meaningful visual representation of event artifacts to share with collogues and management.

Therefore, there is a need for process and system that allows data from multiple points to be manipulated and compared in a meaningful way. Furthermore, the comparison should be capable of being guided by a human operator.

SUMMARY

The present invention is a synchronization and event visualization tool designed to mitigate common data aggregation challenges encountered while processing data from disparate sources. It combines and organizes data from various sources into a comprehensive visualization of the representative sequence of events. An interactive visual interface allows analysts to quickly navigate to key moments of each event, providing a detailed geospatial and temporal context for understanding the event and directing further analysis. Additionally, the present invention's presentation production toolset and media synchronization allows users to summarize and report their findings to decision makers in a clear and informative visual presentation.

The present invention is directed to an event visualization method and system. The system includes initializing a location data set of a physical entity comprising location data points. The location data points contain location metadata constituents. Preferred metadata constituents include geospatial indicia and time indicia. The method initializes a multimedia file from a vantage of the entity comprising multimedia metadata constituents.

A file manipulation engine compares metadata constituents of the location data points to metadata constituents of the multimedia file to ascertain categorical metadata constituents. The engine normalizes the categorical metadata constituents to ensure uniformity of data.

A visual display renders a sequential dimensional representation of the location data set changing as a function of at least one metadata constituent. During the rendering step, a multimedia file that has been correlated to at least one of the location data points is initiated. The correlation is based on at least one of the categorical metadata constituents.

The event visualization method may initialize a first multimedia file from a first physical entity comprising multiple quantifiable first multimedia metadata constituents. A second multimedia file may be initialized from a second physical entity comprising multiple quantifiable second multimedia metadata constituents. The quantifiable metadata constituents of the multimedia files may be compared to ascertain categorical quantifiable metadata constituents and normalize the categorical quantifiable metadata constituents.

The visualization method may determine a domain of the quantifiable metadata constituents to render on a visual display the first multimedia file and the second multimedia file in synchronization and based on a sequential rendition of the first multimedia file and the second multimedia file further based on, and substantially equivalent to the domain of, any selection of the multiple quantifiable categorical metadata constituents. A physical relationship is concluded based on a physical relationship based on any selection of the multiple quantifiable categorical metadata constituents between the first physical entity and the second physical entity.

These aspects of the invention are not meant to be exclusive. Furthermore, some features may apply to certain versions of the invention, but not others. Other features, aspects, and advantages of the present invention will be readily apparent to those of ordinary skill in the art when read in conjunction with the following description, and accompanying drawings.

DETAILED DESCRIPTION

Figure 1:
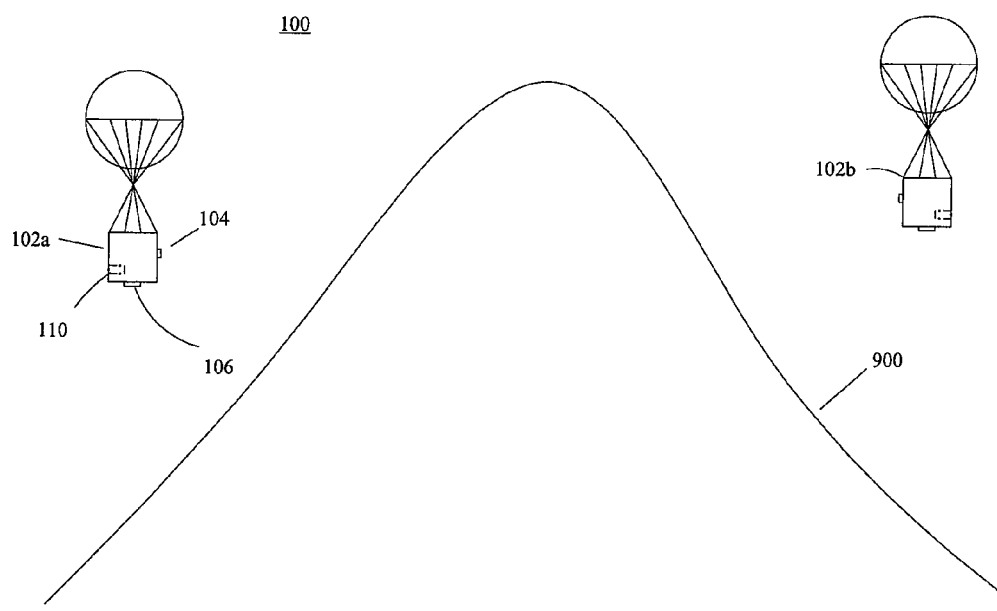
FIG. 1 is a view of the system of the present invention.

Referring first to FIG. 1, a basic embodiment of the event visualization system 100 is shown. The system 100 includes one or more physical entities 102a, 102b. The physical entity of the present invention includes any person or thing whose position may be desired to be tracked for later event visualization. An example physical entity, and one that will be presently discussed, is a weather balloon. The physical entity 102a has a quantifiable relationship with another physical entity (e.g., an ancillary physical entity 102b) or ecosystem 900. In the event that a visualization of the physical entity 102 or the experiences thereof is desired for later informational analysis, the experiences of the physical entity are retained. By experiences, it is meant the observations of the physical entity 102 as they relate to (i) observations of the physical entity 102 as they relate to the attributes of the physical entity 102 itself, (ii) perceptions of the physical entity 102 as they relate to the attributes of another specific entity, including an ancillary physical entity, and (iii) the perception of the physical entity 102 with respect to its general surroundings. The physical entity may be any tangible object whose relevance may be determined on a case-by-case basis, including subsequent to an incident for which data analysis is beneficial. The physical entity need not be owned or managed by the source operating the present invention, and often will not be; the present invention excels at aggregating facially disparate data types from disparate data sources into a single, combined simulation.

The physical entities 102 generate experiences through the use of a detection array 104. The detection array 104 includes the equipment necessary to generate the observations and perceptions described above. Preferred experiences include as either observations or perceptions: geolocation data, time indicia, wind speed, wind direction, pressure, velocity, altitude, temperate, humidity, acceleration, angle, torque, linear momentum, level, electrical readings, density, deformation, shape, radioactivity, audiovisual capture, measures of confidence, actions, communication (text, email, web browsing, etc.), electronic emissions, etc. Within the present specification, "observation" is meant to include measurement of phenomena related to the physical entity 102 carrying the detection array 104; "perception" is meant to include measure of phenomena exterior to the physical entity 102 carrying the detection array 104. The physical entity detection array carries one or more instruments adapted to measure the above phenomena, such as thermometers, accelerometers, Global Positioning System instruments, barometers, etc. The sources of data frequently include detection arrays in the environment as well as mounted on other controlled and uncontrolled physical entities. In general, the invention makes no assumptions about how the data is collected. It provides the tools necessary to be able to visualize and organize the data for visualization.

Figure 7:
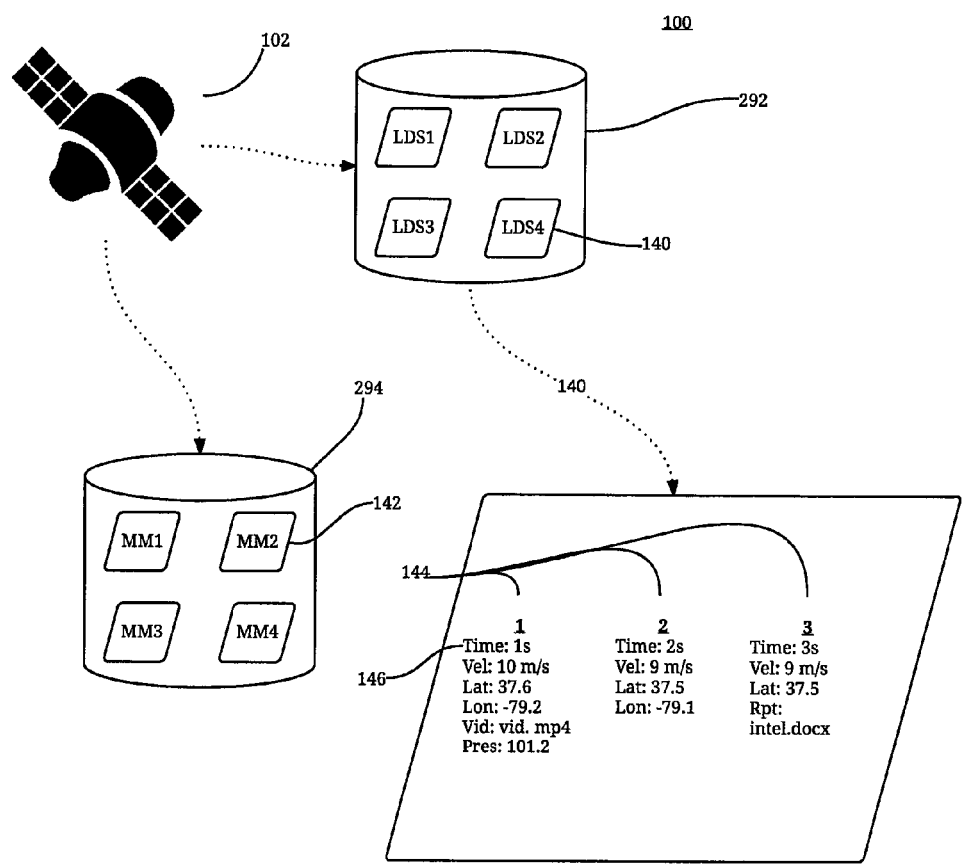
FIG. 7 is a view of the system of the present invention.

Turning now to FIG. 7, the physical entity detection array generates information sufficient to create an entity location data set 140. The location data set may be constructed as a formatted data file at the time of creation, or the location data set may be created in post-production as a result of normalizing and aggregating disparate data types, or otherwise. The location data set 140 includes data points 144 that include metadata constituents 146. That is to say the location data set 140 is arranged as a function of a single data type, whether time, altitude, pressure, etc. As the nature of arrangement of data by time represents a preferred embodiment, the data points 144 of FIG. 7 are arranged by time. The data points are stored as a series of quantities pursuant to which the metadata constituents are correlated. For example at time domain 1: the metadata constituents stored thereunder include Time: 1 s; Velocity: 10 m/s; Latitude: 37.6; Longitude −79.2; Video: vid.mp4; and pressure 101.2. As the data points progress, the metadata correlated therewith is stored therewith. The metadata constituents need not be constant; in other words, the metadata constituent of longitude may be present in one data point but not another. The metadata constituents need not be exactly correlated to the data type representing the data point; in other words, at time Time: 1 s there may be a velocity reading of 10 m/s while there is no velocity reading at Time: 2 s, yet there is a velocity reading at Time: 2.2 s of 12 m/s. In such a case, the velocity element at Time: 2 s may be omitted, or estimated (for example, by plotting an average acceleration between the time points 1 s and 2.2 s and extrapolating the velocity at 2 s), or other. The location data sets may be stored in table form, list form, or other data storage form. Although the data sets discussed herein as discussed as location data sets, this is because data sets relating to a location are a preferred embodiment of the present invention; data sets may be categorized pursuant to any data type.

Figure 5:
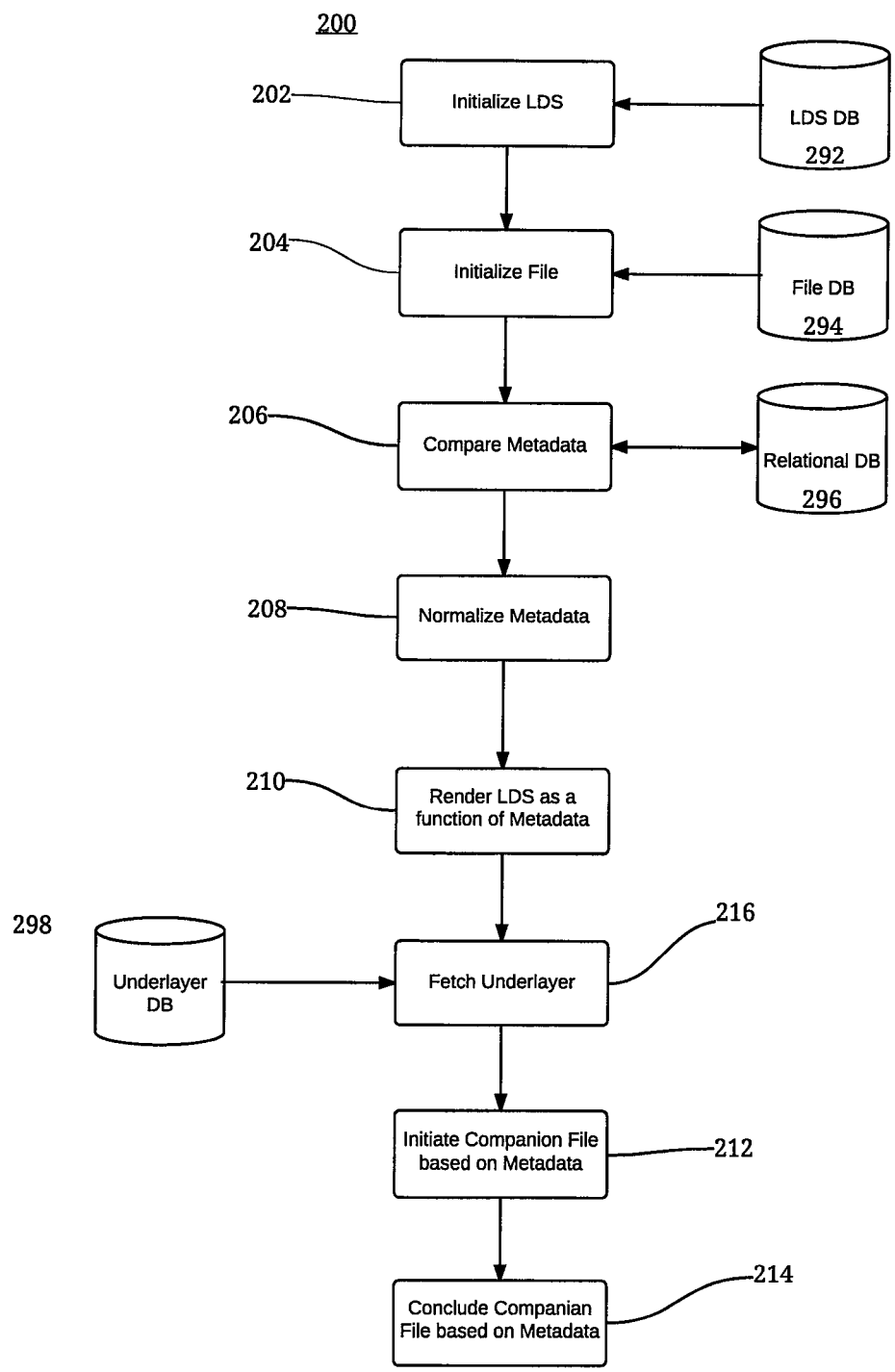
FIG. 5 is a view of the process of the present invention.

The present invention permits data relationships to be explored in a new, granular manner. A primary basis of the relationship exploration is the linking of an executable file 142 in a file database 294 to a data set 140 in a data set database 292. When FIG. 7 is viewed in conjunction with FIG. 5, the method 200 of the present invention initializes 202 the data set 140. By initializing, it is meant to make an executable file or data available for further processing. An executable file 142 is initialized 204. A file manipulation engine within memory examines data to determine a data type of each set of data desired to be used with the present invention. For example, the file manipulation engine may look for velocity data types in multiple data sources to notate that the data from different files are categorically equivalent, irrespective of measurement units (e.g., m/s, km/h, etc.) and file types (.xls, .csv, etc.). Furthermore, the file manipulation engine compares the data of the data sets 140 to any data that may be present in the executable files 142. By executable file, it is meant any file having data and capable of running a software routine on instructions contained within the file (e.g., MS Word program), or any file capable of running a software routine on instructions contained within the file and is capable of accessing data from an exterior file (e.g., browser sending a GET request based on a link), or any file having data preformatted to the specifications of an identified file type for being run as a software routine on instructions contained within an exterior software program (e.g., jpg or mpg.). Examples of executable files include movies, pictures, audio files, graphs, etc.

Executable files, especially movies, often have data elements associated with the data displayed therewith. Movies for example, may reference as internal data: time, date, location, latitude, longitude, creator, etc. The file manipulation engine compares 206 data types internal to the executable file to data types of the data sets. The file manipulation engine may access a relational database 296 that correlates related data sets and provides conversion functions and other information helpful for comparison and manipulation. The file manipulation engine in its comparison is looking for data of similar categories, e.g. Time: Time, Velocity: Velocity, etc. In its analysis of file data, the file manipulation engine may further normalize 208 the metadata. Normalization 208 under the present invention means checking to ensure that the data can be meaningfully related together in a valid comparison, and includes one or more of the following actions: (i) checking to ensure that the data needs no normalization; (ii) ensuring that data is appropriately parallel (e.g., to ensure that the data operates in relation to a common reference, i.e. a datum of 5 s for a file starting at 12:57:05 may be normalized to 12:57:10 when the appropriate reference is a timeline generally rather than a relative time standard); (iii) to ensure that data is expressed in the same units (e.g., kg/hr to m/s); (iv) to ensure that data is expressed in the same logical form (e.g., integer, decimal, character array); (v) to ensure that data originating from difference sources is expressed with an expected variance of measurement (e.g., an electronic emission detected by two separate physical entities may have variance in the emission frequency detected). In certain embodiments of the present invention the normalization 208 step may be the first step performed pursuant to a massive ingest process by which data is identified and normalized.

The data constituents of the executable files are correlated to the data constituents of one or more data sets. In other words, the applicability of an executable file based on its data constituents is discerned and then noted. The preferred notation is incorporation into the data set itself as a pointer, however, the notation may be through a discrete list or direct insertion of the data into the data set. As shown in the metadata constituents 146 of FIG. 7, the date point no. 1 includes a pointer to a video file, "vid.mp4." Vid.mp4 was determined to be applicable to the data point no. 1 just as "intel.docx" was determined to be applicable to data point no. 3.

Returning to FIG. 1, along with reference to FIGS. 2-5 and 7, the data sets 140 created by the physical entity 102*a* may be related to location data, and there may be a multimedia files 142. The multimedia files 142 are stored in the file database 294 and the location data sets are stored in the location data set database 292 which may be created within the memory 110 of the physical entity 102*a*. The physical entity creates data, whether or not formatted as a structured data set of the present invention, as it undertakes activity. Here, the whether balloon 102*a* may be released proximate to an object 900, i.e. a mountain or a second/ancillary physical entity 102*b*. While aggregating location data the detection array may further include multimedia detection, for example a camera that is taking pictures each second. The pictures may be saved as multimedia files in the memory of the physical entity. For the purposes of the present disclosure, the location data set may be capturing the GPS coordinates of the physical entity in three-dimensions. A preferred embodiment of the present invention generates both an entity location data set comprising location data points bearing location metadata constituents, including geospatial indicia and time indicia, and multimedia files from a vantage of the entity comprising multimedia metadata constituents.

The system 100 includes a visual display 120 adapted to render a sequential dimensional representation of the data set. The visual display 120 includes a screen or other means for rendering visual elements. Examples of visual displays suitable for use with the present invention include mobile electronic communication devices, laptops, computers, televisions, and the like. The visual display 120 is in signaled communication with a computer 150, which may include any arithmetic logic unit, capable of storing information in memory and processing program instructions. By sequential dimensional representation 116 of a data set, it is meant that there is a rendering 210 of the magnitude of the data set constituent as a function of a second data set constituent, and that depiction occupies at one dimension. In the weather balloon example, the altitude may be represented as a function of time. As the weather balloons altitude changes, the representation may rise and fall proportional to the altitude of the weather balloon with a trace revealing previous altitudes. In a preferred embodiment, an underlayer is fetched 216 from an underlayer database 298 to position as an underlay to the representation. In the weather balloon example, GPS coordinates may be displayed as a representation 116 as a function of time in three-dimensions. An underlayer for such an embodiment may include a map, such as a satellite map, road map, pulse-doppler precipitation map, or topographical map. The position of the weather balloon, as the physical entity, is rendered 210 in the representation 116 over the course of a time span.

The system 100 and method 200 further initiates 212 during the rendering step 210 one or more executable files. As the data set, here a location data set, corresponding to geolocation data, is depicted as a function of time, an executable file is correlated to the time data type of the location data set, for example as in the pointer correlation in data point no. 1 of FIG. 7. When the data set renders the data point to which an executable file is correlated, the executable file is executed. In the case of a multimedia file, the multimedia file may be depicted/played; and further in the case of the weather balloon example, a video recorder as the detection array may capture views of the mountain (object 900) from the vantage point of the weather balloon. By vantage point, it is meant the perception of one object from the perspective of a second object.

It is preferred that the executable files 114*a* are initiated in a discrete file window 112 with an indication (here, a dashed line) to mark the point (here, moment) whereby the multimedia file relates to the data set. It is preferred that the program track the rendering of the data set to position the file window in a way that prevents it from interfering with the data set depiction. The executable file may not only be initiated pursuant to a data point, but also concluded 214 pursuant to metadata constituents within the executable file as may be correlated to data points within a data set. For example, a movie that begins at Time(X)=14:30:25 and ends at Time(Y)=14:30:55 may be correlated with a beginning pointer at Time(X) and an end pointer at Time(Y). The movie may be initiated at Time(X) and concluded at Time(Y); in the interval the movie plays in concert with the rendering of the data set.

The weather balloon example is but an example of a logical use of the present invention. Furthermore, the present invention may render 210 a data set as a function of altitude. For example, if two survey drones 102*a*, 102*b* as physical entities, as in FIG. 1, are dropped from arbitrary heights above a mountain, the object 900. If the physical features of the mountain in multiple dimensions are the purpose of the venture, then the vantage of the physical entities as a function of time is less appropriate than the vantage of the physical entities as a function of altitude/height. As the parachute-aided drones are dropped and capture pictorial views of the mountain from their respective vantage points, the location data sets are updated with the geolocation of the drones as stored in the data set database 292 and the multimedia depictions of the mountain as multimedia files stored in the multimedia file database 294. Once rendered, the location data set may be rendered as a function of altitude, which may include a representation 116 of a pointed line descending at the rate of descent of the drone with a pictorial depiction of the picture of the mountain at that altitude. Each drone 102*a*, 102*b* may have its distinct representation 116*a*, 116*b* on the visual display 120 with its distinct depiction of companion multimedia files 114*a*, 114*b* initiated 212 at the altitude corresponding to the data point contemporaneously being rendered 210.

In a further embodiment of the present invention, the method of the present invention initializes a first multimedia file from a first ancillary physical entity. The multimedia file includes location metadata constituents in reference to the estimated location of a target entity. A second multimedia file, from a second ancillary physical entity is initiated and includes a multimedia executable file in reference to projected visual imagery of the target entity. Once rendered, in synchronization and sequentially on the visual display, visual imagery of the target entity can be visualized in conjunction with the current location of the target entity.

An example of the previous embodiment can be given by considering the data police may utilize to investigate a crime. After the police gain evidence that a suspect may have committed a crime. The police may receive a warrant and pull cell phone tower records from a major cell phone provider. The cell tower records may contain location data for the suspect's cell phone during the incident time of the crime. Then they may pull video surveillance data from various Department of Transportation street cameras and nearby convenience stores. When the invention displays the data in synchronization and sequentially, users of the invention can visually witness the location of the suspect and in conjunction with video accounts of his actions at each location that recorded his actions through video surveillance. This form of data visualization is particularly valuable for a jury when walking through the events of a suspect's activity during the incident time of a crime.

In a further embodiment of the present invention, the method of the present invention initializes a first multimedia file from a first ancillary physical entity. The multimedia file includes location metadata constituents in reference to the estimated location of a target event and metadata constituents that uniquely identify the target event. A second multimedia file, from a second ancillary physical entity is initiated and includes metadata constituents that provide a detailed account of what occurred at the target entity and metadata constituents that uniquely identify the target event. In the event the uniquely identifying metadata constituents are equivalent between both perspectives of the target event, the metadata constituents are resolved into a single event. Once rendered as a single target event, the location metadata constituents of the target entity can be visualized in conjunction with the metadata constituents providing a detailed account what occurred of the target entity.

Figure 6:
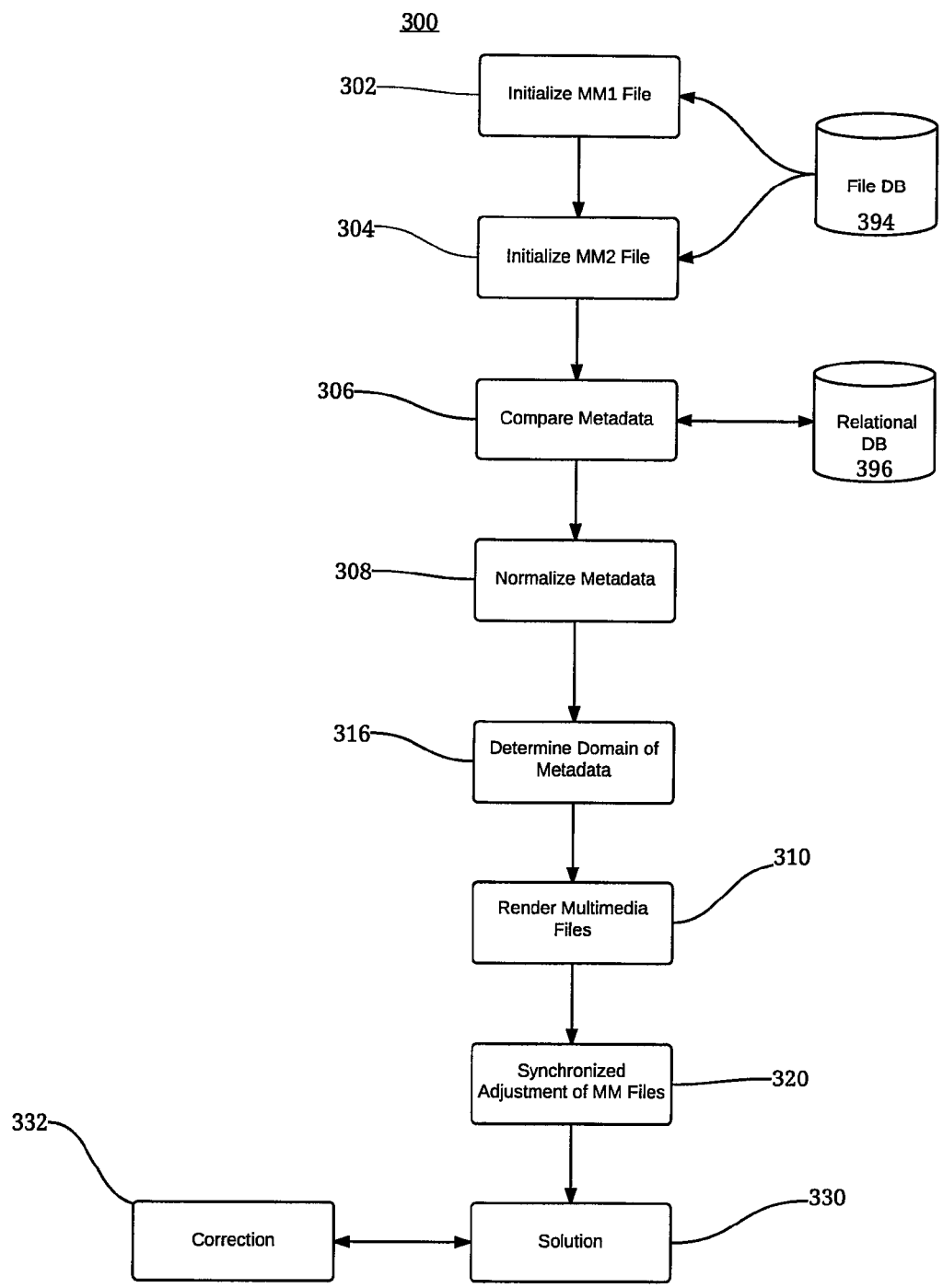
FIG. 6 is a view of the process of the present invention.

In a further embodiment of the present invention depicted in FIG. 6, the method 300 of the present invention initializes a first multimedia file from a first physical entity. By multimedia file, it is meant a file that upon execution represents a work of textual, audio, or visual nature. The multimedia file includes quantifiable first multimedia metadata constituents. A quantifiable data element is any data that can be expressed as a quantity or magnitude, for example 100 degrees Celsius, but not "hot." An exemplary data category capable of quantification include time indicia. A second multimedia file, from a second physical entity is initiated 304 and includes quantifiable second multimedia metadata constituents. The multimedia files are pulled from a file database 394.

Quantifiable metadata constituents are compared 306 to ascertain categorical metadata constituents. Categorical metadata constituents are those data elements that are of the same category, for example velocity data in a first multimedia file are categorically related to velocity data in a second multimedia file, but time data would not be categorically related to temperature data. Whether data is of the same category may be determined definitionally rather than substantively through the use of a relational glossary found in a relational database 396. Metadata of the multimedia files may be normalized 308 as described elsewhere in this document.

The domain of the categorical quantifiable metadata constituents is determined 316. By domain, it is meant the set of data values for which a data category has values. For example, for a video of thirty seconds length, the domain may have values at each second from one to thirty seconds; or more likely, depending on the granularity desired by the program, the domain may be the frame rate multiplied by the time span of the video. The domain may include (i) actual data element values captured, (ii) data element values extrapolated/estimated to predetermined data values; (iii) a smaller set of data element values culled from a greater set of data element values; or (iv) otherwise.

The multimedia files, first and second, are rendered 310 in synchronization and sequentially on the visual display as a function of, and substantially equivalent to the domain of, any selection of said multiple quantifiable categorical metadata constituents. A selection of metadata constituents may be offered to the user of the present method 300. A common means of qualitatively comparing multimedia files is based on time; however, here the multimedia files may be rendered sequentially and in synchronization. The sequential nature of the present invention provides that the selected data type controls the rendered nature of the multimedia file. A multimedia file may be rendered pursuant to time, as is commonly done, or a multimedia file may be rendered based on, say, altitude. Because the domain of the altitude has been determined for the first multimedia file and the second multimedia file, the first multimedia file may be presented sequentially by altitude rather than time. Because the metadata has been normalized, the multimedia files may be rendered in synchronized fashion pursuant to any of the selectable data element types of the multimedia files. Rather than playing a series of photographic stills by time, for example, such still may be progressed by latitude, distance from an origin, geolocation, or other; and furthermore, the photographs from the vantage of two or more disparate physical entities may be compared based on similar data values as synchronized based on the data value types. Furthermore, the sequence value of data, and the first multimedia file or portion thereof, related to the data value can be adjusted in synchrony with a data value of the second multimedia file. For example, in the descending drone example, multimedia files may be depicted based not on time or altitude, but instead on humidity or pressure. In the event that multiple multimedia files, or portions thereof, correspond to a particular data value, multiple windows may be utilized to depict the multiple files or portions thereof. The multimedia files may be adjusted 320 sequentially in forwards or reverse while remaining synchronized. In other words, in instances where the multimedia files are sequenced according to altitude, say from 0.0 m to 10.0 m, the present invention may display multimedia files from 2.0 m to 5.0 m sequentially by altitude wherein multimedia files from two entities are rendered at the same time at the same altitude. The present invention may scroll the altitudes in reverse or forwards with both altitudes being equal and displaying the multimedia files created at the altitudes displayed.

Although the present invention allows the files to be displayed in synchronization, this is predicated on the sequential equivalence between the files. To the extent that the domain of a first file runs from Time=0 s to Time=90 s, and a second file runs from Time=15 s to Time 30 s (and time is the data point chosen as the basis of the sequence), then the first file will be rendered from Time=0 s to Time=14 s absent a rendering of the second file. From Time=15 s to Time=30 s, the files will be synchronized by the sequential order based on time. And then from Time=31 s to 90 s, the first file may be rendered absent the second file. In other words the system and process are capable of synchronization at data points, but the invention is not tied to only display of synchronized points.

Figure 2:
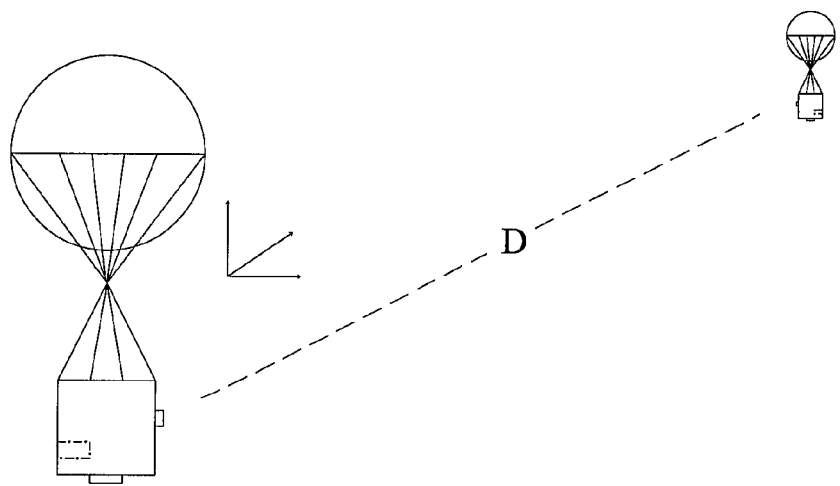
FIG. 2 is a view of the system of the present invention.
Figure 3:
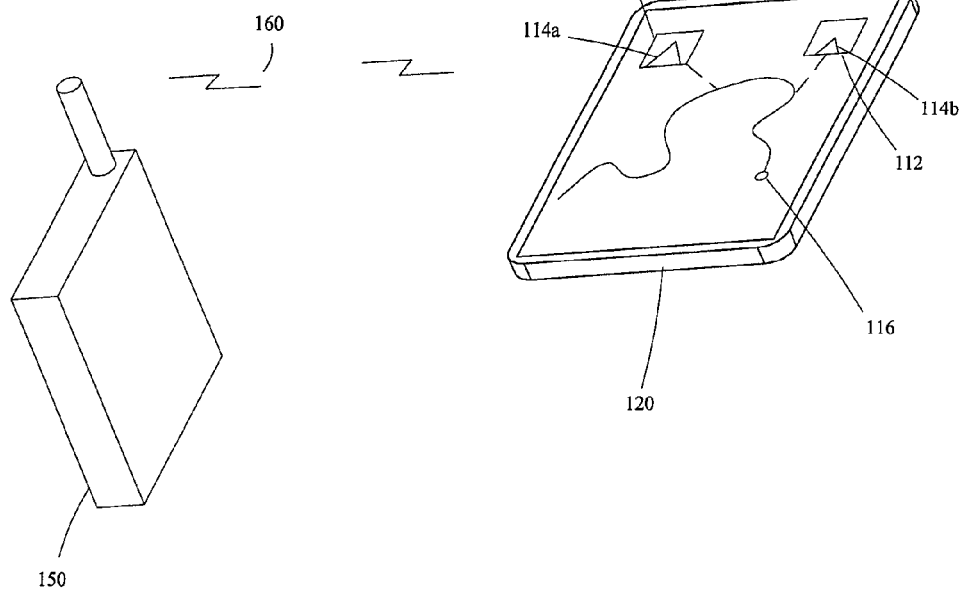
FIG. 3 is a view of the system of the present invention.
Figure 4:
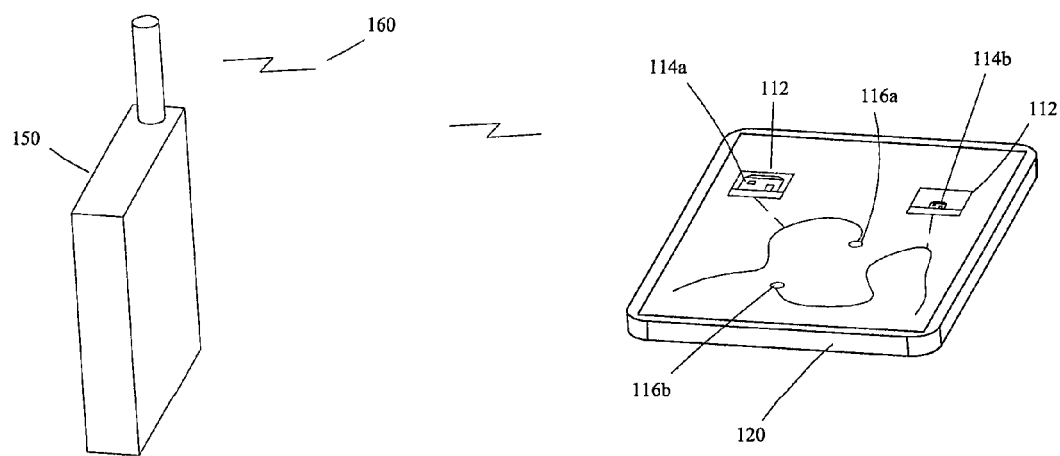
FIG. 4 is a view of the system of the present invention.

The method concludes 330 a solution based on the relationship between the metadata constituents of the first multimedia file and the second multimedia file. A preferred example is to draw a geospatial relationship between the first physical entity and the second physical entity, as shown in FIG. 2. The relationship may extend beyond geospatial data, including indicating any metadata constituent relationships between the first physical entity the said second physical entity. When a broad range of metadata constituents are considered, the present invention may expose previously unknown metadata constituent relationships between said first physical entity and said second physical entity. A preferred concluded solution 330 is an output of two metadata constituents from the separate entities along with a calculation expressing the relationship between the metadata constituents. Another conclusion 330 may indicate synchronization issues in which categorical metadata constituents are inappropriately parallel in order to provide a means to modify in bulk the categorical metadata constituents of the second physical entity to be appropriately parallel to the first physical entity, in which case a manual alteration 332 may be applied for a final product or for reprocessing of data through one of more steps of the process 300 of the present invention. A conclusion 330 may indicate normalization issues, data integrity flaws, and incomplete data, wherein the alteration 332 step may provide a means to normalize, correct, and augment metadata constituents of the first physical entity and the second physical entity. A conclusion 330 may alert a user to a duplicate representation of the first physical entity, wherein the alteration 332 step may provide a means to resolve/winnow duplicate physical entity representations into a single physical entity representation. A conclusion 330 may indicate a visual representation that provides situational awareness and event understanding previously unavailable. The visual representation may include a visual overlay for a map, as described in other embodiments of the present invention and/or the visual representation may spatially relate to the first entity or second entity in a way that provides information tied to the metadata constituents. An example of a spatial relationship tied to an entity may include a bomb blast radius or firearm line of sight or coloring indicia of the entity in a color scheme gradient relating to danger, whereas an example of a visual representation not tied to an entity includes providing a color scheme alert merely in conjunction with the entity. The visual alert may directly relate to a constituent of may be derived therefrom; an example of the former may include a color gradient related to vehicle speed, an example of the latter may include a color gradient related to danger based on vehicle speed.

Other embodiments of the present invention may include multiple physical entities bearing radioactivity sensors. Multimedia files bearing radioactivity metadata constituents may be sequentially rendered, and when prompted by user of the process, the process and system may indicate a relationship between the metadata constituents at a moment selected by the user. For example, if the multimedia files includes videos with frames displayed, not as a function of time, but as a function of Curie reading, a user could halt the video display at a particular point at which the system and process may inform the user of the distance between the physical entities or the acceleration thereof.

When a file is sequentially displayed as a function of time, there are rarely sequence problems. There is only one Jan. 1, 2015, 14:30:00 Zulu. However, when a multimedia file is arranged as a function of a non-unique element, e.g. pressure, multiple portions of the multimedia file may occupy a sequence space. To accommodate for this, the present invention should have a basis of raising or lowering granularity of measurement, utilizing multiple windows for a single file when appropriate, initiating high or low pass filters that block data beyond a particular range, or utilizing a secondary basis of sequential arrangement. A secondary basis of sequential arrangement permits the present invention to arrange data primarily on the basis of its sequence for a prime data category (e.g., pressure) and to permit a more linear sequence utilize a secondary data category as a tie breaker (e.g., time). The second data category should preferably be one with more unique values. To the extent that sequential times cannot be, or are desired not to be, perfectly linearly, the present invention may decide to display multiple files for a single data point. For example, a weather balloon may have multiple occurrences of altitude of 50.0 m; and rather than attempting to fashion a linear arrangement out of a data set that inherently lacks a linear data set (e.g., time), two or more of an entity's multimedia files related to its perception at that altitude may be displayed for altitude=50.0 m.

Figure 8:
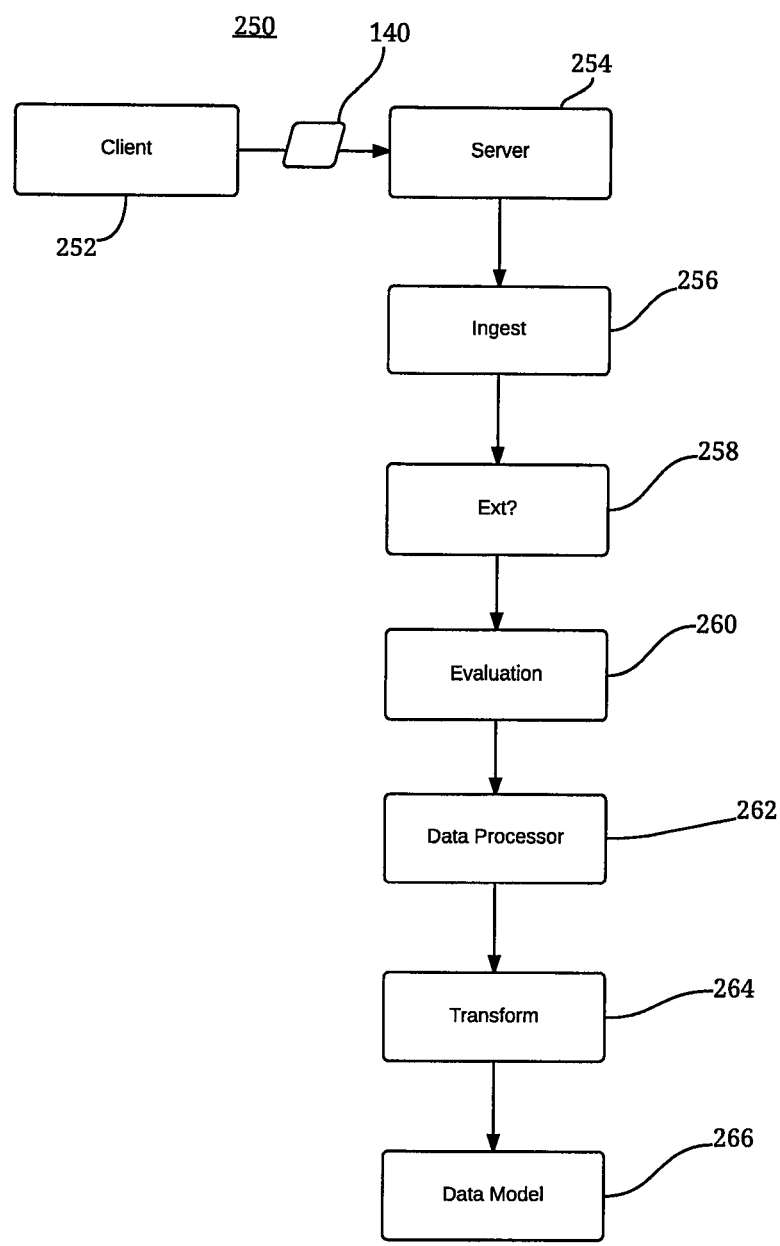
FIG. 8 is a view of the file manipulation engine of the present invention.

Turning now to FIG. 8, the file manipulation engine 250 for manipulating data to conform efficiently to the present invention. A client 252 and server 254 are in communication such that information 140, such as files, may be passed therebetween. The communication may be over a local area network or wide area network—or other form of computer-to-computer transmission. Alternatively, a file may simply be present on memory local to the processor adapted to perform a process 200, 300 of the present invention. The file is ingested 256 are recognized as being capable of use with a process 200, 300 disclosed herein.

There are now a series of decisions to determine the nature of the file. A computation-efficient means of analyzing the data of a file is to simply examine 258 the extension of the file. This could be problematic, as data within a file may not conform to the published parameters of the extension. The file may be evaluated 260 to determine whether the file contents fit within a known file architecture from which the file manipulation engine 250 may glean data for aggregation into a data set or whether data sets preformatted for the present invention are pre-existing on the file. The evaluator 260 may further form a decision based simply on the existence of a recognized extension.

Data is then passed to a data processor 262 that transforms 264 the data into a common data model 266 that is used to compare like data types, insert pointers to executable files, and the like. The preferred common data model is conceptually similar to the data model expressed in the file 140 of FIG. 7.

Figure 9:
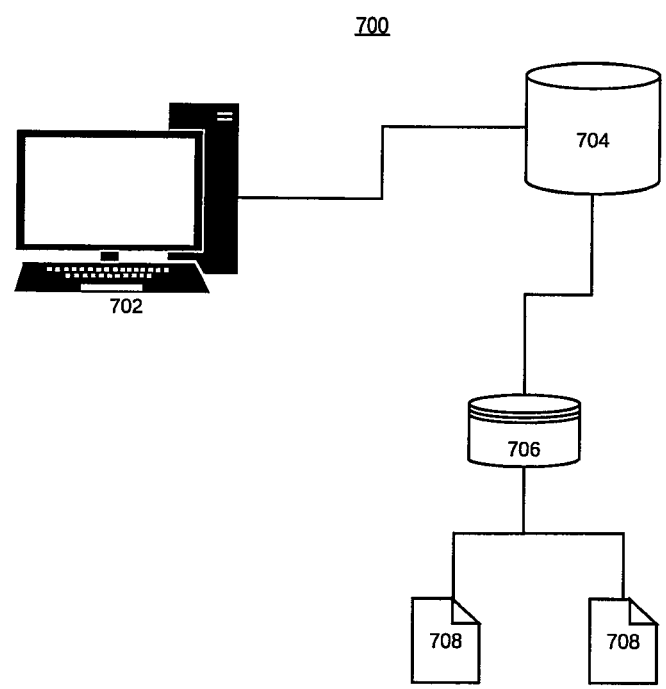
FIG. 9 is a view of the computer ecosystem of the present invention.
Figure 10:
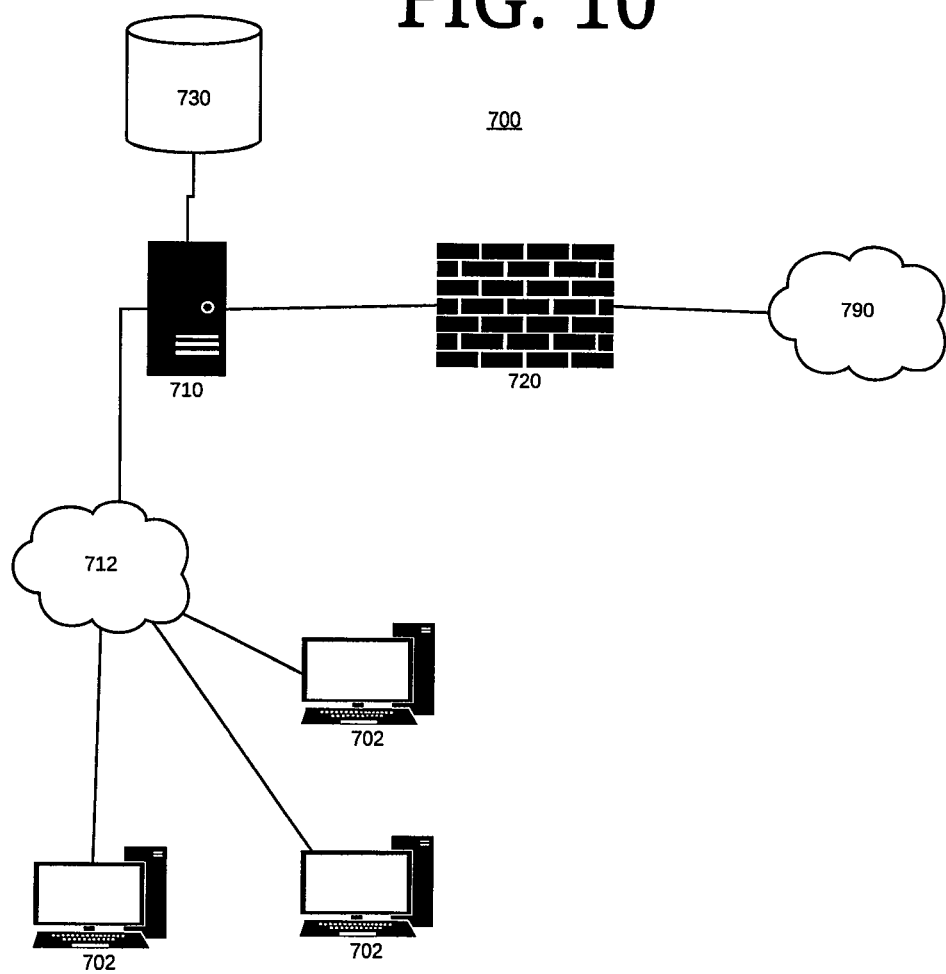
FIG. 10 is a view of the computer ecosystem of the present invention.

FIGS. 9-10 depict a computer ecosystem 700 of the present invention. By ecosystem it is meant one or more computers 702 that are organizationally related. The ecosystem may include computers under common ownership, computers that belong to the same network or series of networks, computers that are collaborating, etc. The present invention may be provided as a computer program product, or software that may include a computer-readable storage medium 704 having stored thereon instructions, which may be used to perform the process of the present invention across a computer ecosystem 700 according to the various embodiments disclosed herein.

A computer 702 of the present invention may include any combination of one or more computer readable media 704. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium 704 may be any tangible medium that can contain, or store a program for use by or in connection with an instruction execution system, apparatus, or device.

A computer readable signal medium 704 may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures described below illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Furthermore, the functionality of one block may be subsumed by the functionality of another block as a substep thereof. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

An ecosystem 700 may further include a computer network or data network that allows computers to exchange data. In a computer network of the present invention, networked computing devices pass data to each other along data connections. The connections between nodes are established using cable media, wireless media, or other media. The Internet or other exterior network 790 may be a component of the ecosystem 700. Nodes may include hosts such as personal computers, phones, servers, and networking hardware. Two such devices are networked together when one device is able to exchange information with the other device, whether or not they have a direct connection to each other. Computer networks of the present invention support applications such as access to the World Wide Web, shared use of application and storage servers, printers, and fax machines, and use of email and instant messaging applications. Computer networks may be included irrespective of the physical media used to transmit their signals, the communications protocols to organize network traffic, the network's size, topology, and organizational intent.

It is preferred that the network of the present invention have at least one boundary 720, and potentially multiple boundaries if a demilitarized zone is utilized. The boundary 720 may include any number of layers designed to regulate and secure the flow of information between networks. Boundary layers of the present invention may include enterprise content management software, firewalls, filters, threat management software, alarms, etc. Software for establishing a boundary may be run on a server 710 with server storage 730 of the present invention, which may include directory services controlling access credentials.

To combat security risks posed by network connections, firewalls are frequently used. A firewall may be a hardware or software component that filters network traffic so that communications with unauthorized third parties are blocked but legitimate network functions may be carried out. Frequently, the filters applied by a firewall are specified by a set of policies defining characteristics of network messages that either should pass through the firewall or that should be blocked. Because different levels of communication may be appropriate depending on the origin or destination of messages, firewall policies may be provided for each application that executes on a computing device and communicates over a network.

A firewall may have an outward side facing a global network, such as the Internet. The opposite side of the firewall may be a private network that is protected by the firewall. The private network may include any number of host machines (e.g., computers) each addressable by its own IP address. The physical construction of the network may be such that all data packets intended for one of the IP addresses behind the firewall pass through the firewall. Using the firewall rules, which may be set by a network administrator or other user, the firewall may determine whether to allow or deny certain data packets and/or determine where to route particular data packets based on the IP addresses to which the packets are directed. The determination of where to route data packets may be done using the IP addresses of the host machines in the private network.

Depending on the addressing scheme used by the network, the IP addresses of the host machines may be static or dynamic. Static IP addresses do not change over time, and thus once they are set in the firewall rules, there is no need to update them. The Internet Protocol version Four (IPv4) addressing system commonly uses static addressing, while IPv6 may use dynamic addressing. Dynamic IP addresses may change over time and thus, there is a need to update the firewall rules as changes occur. When a small Local Area Network (LAN), such as a domestic network in a private residence, is linked to a larger network such as the Internet, the link is often through a gateway router acting as a firewall. One of the functions of the firewall is to protect the LAN from intrusion from outside.

A service directory accessible by a server 710, usually on server storage 730, stores information about network resources across a domain. An example of a directory service is Active Directory. The main purpose of Active Directory is to provide central authentication and authorization services for Windows-based computers. Active Directory also allows administrators to assign policies, deploy software, and apply critical updates to an organization. Active Directory stores information and settings in a central database.

An Active Directory structure is a hierarchical framework of objects. The objects fall into three broad categories: resources (e.g. printers), services (e.g. e-mail) and users (e.g., user accounts and groups). The Active Directory provides information on the objects, organizes the objects, controls access and sets security. Certain objects can also be containers of other objects. An object is uniquely identified by its name and has a set of attributes—the characteristics and information that the object can contain—defined by a schema, which also determines the kind of objects that can be stored in the Active Directory.

Typically, the highest object in the hierarchy is the domain. The domain can be further sub-divided into containers called Organizational Units. Organizational units give a semblance of structure to the organization either based on administrative structure or geographical structure. The organizational unit is the common level at which to apply group policies, which are Active Directory objects themselves called Group Policy Objects. Policies can also be applied to individual objects or attributes as well as at the site level (i.e., one or more IP subnets).

The present invention may use one of more communication networks to foster information exchange throughout the computers of the ecosystem. Communication networks might either be private or public. In a private network, communications between multiple computers occur in a secure environment that prevents access from outside the network without appropriate authentication. These networks are considered as "trusted" networks because the communication signals securely travel from one computer to another within the private network without being exposed to the external environment.

Public networks such as the Internet, on the other hand, are not secure because the communication over these networks is not private and is susceptible to interception by other computers. In addition, the public networks cannot guarantee the delivery of the data packets being sent. They allow packets to be injected into, or ejected out of, the networks indiscriminately, and analyzed while in transit. To keep data sent over a public network private, a Virtual Private Network (VPN) is commonly established on top of a public network when two computers use the public network to communicate with each other. In a Virtual Private Network, data sent from one computer to another is encrypted by a security gateway and transmitted in encrypted form over the public network to a second security gateway connected to the receiving computer. The second gateway decrypts the data before forwarding it to the receiving computer. Such a private channel established on top of another network is referred to as a network tunnel.

In order to set up a Virtual Private Network, a user first establishes a path to a VPN server and goes through an AAA process (Authentication, Authorization and Accounting) for identification and authorization to create a secure tunnel with the server. Once the user is authorized, a secure network tunnel is established between the user and the VPN server over the public network, using a VPN protocol such as IPsec. This process requires a VPN client on the user's side, a VPN server and other VPN hardware on the other side of the tunnel, as well as appropriate user configurations.

Today's private networks often include wireless networks such as WiMAX to accommodate mobile access. In addition, to provide mobility access in a large geographic area, a private enterprise often relies on third-party wireless infrastructures besides its own wireless network. In this case, a user's device would need to be authenticated by both a third-party gateway and an enterprise authentication server before it could access the enterprise network. User credentials are typically requested by and securely returned to the third-party gateway. Once the user is authenticated and authorized, the user may communicate with the third-party wireless gateway.

The present invention includes files 708, which may include executable instructions by which the present invention runs, or files upon and with which the present invention interacts. The documents may be on local storage 704 or shared storage 730 and be created, accessed, edited, and/or otherwise modified using any of a number of applications, including for example and without limitation Final Cut Pro, Avid, Microsoft Office applications (Word, Excel, Power Point, Outlook, Visio, etc.), Adobe Reader or Acrobat, AutoCAD, SolidWorks, or any other suitable document editing application. The content of the documents may be audio tracks, video clips, images, word processing documents, presentations, spreadsheets, business documents, engineering documents, databases, etc.

Although the present invention has been described in considerable detail with reference to certain preferred versions thereof, other versions would be readily apparent to those of ordinary skill in the art. Therefore, the spirit and scope of the appended claims should not be limited to the description of the preferred versions contained herein.

What is claimed is:

1. An event visualization method comprising:
   initializing multiple location data sets corresponding to multiple physical entities, said data sets comprising location data points bearing location metadata constituents, including geospatial indicia and time indicia;
   initializing multiple multimedia files comprising multimedia metadata constituents from a vantage of said entity comprising multimedia metadata constituents;
   comparing metadata constituents of said location data points to metadata constituents of said multimedia file to ascertain categorical metadata constituents;
   normalizing said categorical metadata constituents;

rendering on a visual display discrete sequential dimensional representations of said location data sets of said multiple location data sets, said representations changing as a function of at least one metadata constituent; and initiating during said rendering step said multiple multimedia files upon correlating at least one of said multimedia files to at least one of said location data points based on at least one of said categorical metadata constituents.

2. The method of claim 1 further comprising the step of concluding at least one of said multimedia files upon correlating said multimedia file to at least one of said location data points based on said categorical metadata constituents.

3. The method of claim 1 further comprising the step of fetching a multidimensional underlayer displaying terrestrial features, based on, and sized as a function of, said location metadata geospatial, indicia from an underlayer database of terrestrial depictions; and applying said multidimensional underlayer to said dimensional representation.

4. The method of claim 1 wherein said second initializing step includes initializing said multimedia file comprising multimedia metadata constituents, including time indicia; and said normalizing step includes normalizing said time indicia metadata constituents of said multimedia metadata constituents and location metadata constituents.

5. An event visualization method comprising:
initializing a first multimedia file, from a first physical entity, comprising quantifiable first multimedia metadata constituents, including time indicia;
initializing a second multimedia file, from a second physical entity, comprising quantifiable second multimedia metadata constituents, including time indicia;
comparing quantifiable metadata constituents of said multimedia files to ascertain categorical metadata constituents normalizing said categorical quantifiable metadata constituents;
determining a domain of said categorical quantifiable metadata constituents;
rendering on a visual display said first multimedia file and said second multimedia file in synchronization and sequentially based on, and substantially equivalent to a time domain of, said time indicia of said first multimedia file and said second multimedia file; and
indicating a conclusion comprising synchronization issues in which categorical metadata constituents are inappropriately parallel, and providing a corrector to modify in bulk the categorical metadata constituents of said second physical entity to be appropriately parallel to said first physical entity.

6. The method of claim 5 wherein said indicating step includes indicating a conclusion visually on said visual display, said conclusion comprising a comprising a logical relationship between said first physical entity and said second physical entity.

7. The method of claim 5 wherein said indicating step includes indicating a conclusion comprising data compatibility selected from a group consisting of: normalization issues, data integrity flaws, incomplete data sets, and combinations thereof of said first physical entity and said second physical entity, and providing a correction function selected from a group consisting of: normalizing, correcting, augmenting metadata constituents, and combinations thereof of said first physical entity and said second physical entity.

8. The method of claim 5 wherein said indicating step includes indicating a conclusion comprising duplicate representation of at least one of said first physical entity and said second physical entity, and providing a corrector to resolve duplicate physical entity representations into a unified physical entity representation.

9. The method of claim 5 further comprising the step of adjusting said rendering of said first multimedia file and said second multimedia file bi-directionally according to said time domain.

10. An event visualization method comprising:
initializing a first multimedia file from a first physical entity comprising multiple quantifiable first multimedia metadata constituents;
initializing a second multimedia file from a second physical entity comprising multiple quantifiable second multimedia metadata constituents;
comparing quantifiable metadata constituents of said multimedia files to ascertain categorical quantifiable metadata constituents;
normalizing said categorical quantifiable metadata constituents;
determining a domain of said categorical quantifiable metadata constituents; and
rendering on a visual display said first multimedia file and said second multimedia file in synchronization based on a sequential rendition of said first multimedia file and said second multimedia file based on, and substantially equivalent to said domain of, any selection of said multiple quantifiable categorical metadata constituents; and
indicating a conclusion comprising synchronization issues in which categorical metadata constituents are inappropriately parallel, and providing a corrector to modify in bulk the categorical metadata constituents of said second physical entity to be appropriately parallel to said first physical entity.

11. The method of claim 10 wherein said indicating step includes indicating a conclusion visually on said visual display, said conclusion comprising a comprising a logical relationship between said first physical entity and said second physical entity.

12. The method of claim 10 wherein said indicating step includes indicating a conclusion comprising data compatibility selected from a group consisting of: normalization issues, data integrity flaws, incomplete data sets, and combinations thereof of said first physical entity and said second physical entity, and providing a correction function selected from a group consisting of: normalizing, correcting, augmenting metadata constituents, and combinations thereof of said first physical entity and said second physical entity.

13. The method of claim 10 wherein said indicating step includes indicating a conclusion comprising duplicate representation of at least one of said first physical entity and said second physical entity, and providing a corrector to resolve duplicate physical entity representations into a unified physical entity representation.

14. The method of claim 10 further comprising the step of adjusting said rendering of said first multimedia file and said second multimedia file bi-directionally according to said time domain.

15. The method of claim 10 further comprising the step of adjusting said rendering of said first multimedia file and said second multimedia file bi-directionally according to said domain of at least one categorical quantifiable metadata constituent.

16. An event visualization system comprising:
a first physical entity exhibiting geospatial activity and with a detection array adapted to generate: (i) an entity location data set comprising location data points bearing location metadata constituents, including geospatial indicia and time indicia, and (ii) a multimedia file from a vantage of said entity comprising multimedia metadata constituents;

an ancillary physical entity exhibiting geospatial activity and with an ancillary entity detection array adapted to generate: (i) an ancillary entity location data set comprising ancillary location data points bearing ancillary location metadata constituents, including geospatial indicia and time indicia, and (ii) an ancillary multimedia file from a vantage of said ancillary entity comprising ancillary multimedia metadata constituents;

a file manipulation engine adapted to compare metadata constituents of said location data points to metadata constituents of said multimedia file to ascertain and normalize categorical metadata constituents;

a visual display adapted to simultaneously render a sequential dimensional representation of: (i) said first entity location data set changing as a function of at least one metadata constituent and (ii) said ancillary entity data set changing as a function of at least one ancillary metadata constituent, and adapted to initiate during said rendering said multimedia file upon correlating said multimedia file to at least one of said location data points based on at least one of said categorical metadata constituents and said ancillary multimedia file upon correlating said ancillary multimedia file to at least one of said ancillary location data points based on at least one of said categorical metadata constituents.

17. The system of claim 16 wherein at least one of said first physical entity and said ancillary physical entity generates multiple multimedia files comprising multimedia metadata constituents; and wherein said display renders said multiple multimedia files upon correlating said multimedia file to at least one of said location data points based on said categorical metadata constituents.

18. The system of claim 17 further comprising wherein said display concludes at least one of said multimedia files upon correlating said multimedia file to at least one of said location data points based on said categorical metadata constituents.

19. The system of claim 16 wherein said file manipulation engine fetches a multidimensional underlayer file displaying terrestrial features, based on, and sized as a function of, said location metadata geospatial, indicia from an underlayer database of terrestrial depictions; and said display applies said multidimensional underlayer to said dimensional representation.

20. The system of claim 16 wherein said first physical entity generates said multimedia file comprising multimedia metadata constituents, including time indicia; and said file manipulation engine normalizes said time indicia metadata constituents of said multimedia metadata constituents and location metadata constituents.

* * * * *